(12) United States Patent
Loy et al.

(10) Patent No.: US 6,773,652 B2
(45) Date of Patent: Aug. 10, 2004

(54) PROCESS FOR THE MANUFACTURE OF A COVER SYSTEM FOR AN ELECTRICAL-ENERGY METER

(75) Inventors: Garry M. Loy, Raleigh, NC (US); Lars A. Lindqvist, Apex, NC (US)

(73) Assignee: Elster Electricity, LLC, Raleigh, NC (US)

( * ) Notice: Subject to any disclaimer, the term of this patent is extended or adjusted under 35 U.S.C. 154(b) by 0 days.

(21) Appl. No.: 10/263,401

(22) Filed: Oct. 2, 2002

(65) Prior Publication Data

US 2004/0066609 A1 Apr. 8, 2004

(51) Int. Cl.[7] .......................... B29C 45/14; B29C 70/76
(52) U.S. Cl. .................. 264/274; 264/271.1; 264/275; 264/276
(58) Field of Search ................... 264/250, 251, 264/252, 254, 259, 267, 271.1, 274, 275, 276, 279, 279.1; 324/141, 142, 156, 157, 659, 664, 127

(56) References Cited

U.S. PATENT DOCUMENTS

| | | | | | |
|---|---|---|---|---|---|
| 4,626,185 A | * | 12/1986 | Monnet | ................ | 425/110 |
| 4,695,420 A | * | 9/1987 | Grawey et al. | ............. | 264/265 |
| 5,049,810 A | * | 9/1991 | Kirby et al. | ................ | 324/156 |
| 5,296,803 A | * | 3/1994 | Kirby et al. | ................ | 324/156 |
| D362,198 S | | 9/1995 | Meek | ......................... | D10/103 |
| 5,473,504 A | | 12/1995 | Horan et al. | ................. | 361/667 |
| 5,514,959 A | * | 5/1996 | Horan et al. | ................. | 324/110 |
| 5,676,898 A | * | 10/1997 | Yokota et al. | .............. | 264/219 |
| 5,774,328 A | | 6/1998 | Rector et al. | ................. | 361/667 |
| 5,846,465 A | * | 12/1998 | Tsujino et al. | .............. | 264/252 |
| 5,851,470 A | * | 12/1998 | Yokota et al. | .............. | 264/219 |
| 5,861,742 A | | 1/1999 | Miller et al. | ................. | 324/156 |
| D412,859 S | | 8/1999 | Thiel | ............................ | D10/99 |
| 5,997,793 A | * | 12/1999 | Lahnala | ...................... | 264/261 |
| D429,655 S | | 8/2000 | Cowan et al. | .............. | D10/99 |
| 6,174,482 B1 | * | 1/2001 | Reames et al. | ............. | 264/250 |
| 6,210,618 B1 | * | 4/2001 | Bird et al. | .................. | 264/237 |
| 6,258,312 B1 | * | 7/2001 | Heyn | ......................... | 264/252 |
| 6,280,805 B1 | | 8/2001 | Markovich | .................. | 428/34.1 |
| 6,316,932 B1 | | 11/2001 | Horan et al. | ................ | 324/156 |
| 6,495,082 B1 | * | 12/2002 | Ash et al. | .................... | 264/240 |
| 6,558,601 B1 | * | 5/2003 | Reames et al. | ............. | 264/274 |

* cited by examiner

Primary Examiner—Angela Ortiz
(74) Attorney, Agent, or Firm—Woodcock Washburn LLP

(57) ABSTRACT

A preferred process comprises providing a pre-formed, substantially transparent window for a cover of an electrical-energy meter, and molding the cover from a molten resin that, when solidified, is substantially opaque. Molding the cover from a molten resin comprises causing a portion of the molten resin to contact a periphery of the window and allowing the portion of the molten resin to cool and thereby solidify so that the portion of the molten resin, upon solidifying, is molded over the periphery of the window and thereby seals and secures the window to the cover.

15 Claims, 6 Drawing Sheets

PROCESS FOR THE MANUFACTURE OF A COVER SYSTEM FOR AN ELECTRICAL-ENERGY METER

FIELD OF THE INVENTION

The present invention relates electrical-energy meters, also referred to as "watt-hour meters" or "power meters," for measuring consumption of electrical power. More particularly, the invention relates to a cover system for an electrical-energy meter, and to a process for manufacturing the cover system.

BACKGROUND OF THE INVENTION

Electrical-energy meters are often installed in outside locations, and are thus equipped with covers to protect the various internal components of the meter from physical impacts, tampering, exposure to contaminates and adverse weather conditions, etc.

Exposure to direct sunlight can substantially raise the operating temperature of an electrical-energy meter. Electrical-energy meters of the solid-state type are particularly susceptible to elevated operating temperatures. In particular, relatively high operating temperatures are believed to decrease the reliability and the useful life of the electronic components of solid-state meters.

Electrical-energy meters of the electro-mechanical type are generally less susceptible to the effects of direct sunlight than solid-state meters. Electro-mechanical meters are usually equipped with a substantially transparent cover formed from glass. The use of a transparent cover facilitates visual access to the internal components of the meter. This feature is necessary to permit utility-company personnel to periodically read the meter, i.e., to view the nameplate and the display (readout) of the meter and thereby ascertain the amount of power consumed by the user subsequent to the prior meter reading.

Electrical-energy meters of the solid-state type are usually equipped with one or more features that protect the meter from the potentially harmful effects of direct sunlight. For example, the outer casing of solid-state meters is sometimes lined with a reflective or light-colored film that reflects or inhibits the transmission of sunlight. The film usually has a cut-out formed therein to facilitate visual access to the meter's nameplate and display. Lining the outer cover with a reflective or light-colored film can substantially increase the overall cost of the meter. Moreover, reflective or light-colored films do not always provide adequate protection against elevated operating temperatures caused by exposure to sunlight (this phenomenon is typically referred to as "solar heat gain").

Alternatively, the outer cover may be formed from an opaque material that substantially blocks the passage of all sunlight through the cover. This approach generally provides greater protection from solar heat gain than the use of reflective or light-colored films.

Covers formed from opaque materials are usually equipped with a transparent window to facilitate visual access to the nameplate and readout of the corresponding electrical-power meter. The window is typically accommodated in a cutout formed in the cover. The window is usually fixed to the cover by conventional bonding techniques such as adhesive or ultrasonic welding. The need to fix the window to the cover in a separate production step adds to the overall time and cost of producing the electrical-power meter. The specialized equipment needed to perform these production steps also adds to the overall production cost.

Covers for electrical-power meters are often required to meet one or more standards for physical-impact resistance, e.g., Underwrites Laboratories standard UL 916. Meeting these requirements generally requires a strong bond between the window and the cover. The required degree of bond strength can be difficult to achieve using conventional bonding techniques. Moreover, a hermetic (leak-proof) seal is typically required between the window and the cover to protect the internal components of the meter from water and other contaminates. Hermetic sealing between the cover and the window can be difficult to achieve on a consistent basis using conventional bonding techniques.

Conventional bonding techniques such a ultrasonic welding are usually compatible with substantially flat windows only. Hence, design features that require the use of, for example, a curved window, cannot be readily incorporated into electrical-energy meters having covers formed using ultrasonic welding.

Consequently, a need exists for a cover system for an electrical-energy meter that substantially protects the meter from solar heat gain without adding substantially to the production time and cost of the meter, and without detracting substantially from the resistance of the cover to physical impacts or contaminates. A cover system that can accommodate windows other than substantially flat windows is also desirable.

SUMMARY OF THE INVENTION

A preferred process comprises providing a pre-formed, substantially transparent window for a cover of an electrical-energy meter, and molding the cover from a molten resin that, when solidified, is substantially opaque. Molding the cover from a molten resin comprises causing a portion of the molten resin to contact a periphery of the window and allowing the portion of the molten resin to cool and thereby solidify so that the portion of the molten resin, upon solidifying, is molded over the periphery of the window and thereby seals and secures the window to the cover.

Another preferred process comprises placing a pre-formed, substantially transparent window for a cover of an electrical-energy meter in a mold, and clamping a portion of the window between a first and a second surface of the mold so that a periphery of the window is positioned within a cavity defined at least in part by the mold and the periphery of the window. The presently-preferred process also comprises introducing molten resin into the cavity so that the periphery of the mold is substantially immersed in the molten resin, and permitting the molten resin to cool and solidify so that a portion of the molten resin, upon solidifying, is molded around the periphery of the window and thereby seals and secures the window to the cover.

Another preferred process comprises clamping a window for a cover of an electrical-energy meter in a mold so that the window and the mold form a cavity and a portion of the window is positioned within the cavity, and molding a portion of the cover over the portion of the window positioned within the cavity.

A preferred embodiment of an electrical-energy meter comprises a base adapted to be mounted on a supporting surface. The electrical-energy meter also comprises a current sensor assembly comprising a plurality of contact blades extending through the base and adapted to electrically contact a conductor of electrical energy, and a current transformer mechanically coupled to the base and electrically coupled to the contact blades. The current transformer is adapted to produce an electrical output proportional to an electrical current in the conductor of electrical energy.

The electrical-energy meter further comprises a circuit-board assembly comprising a main circuit board electrically coupled to the current transformer and the contact blades. The circuit-board assembly is adapted to calculate a cumulative amount of electrical energy passing through the conductor of electrical energy based on the electrical output of the current transformer and a voltage of the conductor of electrical energy. The electrical-energy meter also comprises a cover system mounted on the base and comprising a substantially transparent window and a cover mechanically coupled to the base. A portion of the cover is molded over a portion of the window.

A preferred embodiment of a cover system for an electrical-energy meter comprises a window formed from a substantially transparent material. The cover system also comprises a substantially cup-shaped cover comprising a circumferentially-extending side portion, a rim portion unitarily formed with a first end of the side portion and adapted to mate with a base of the electrical-power meter, and a lip extending from a second end of the side portion. At least a portion of the lip is molded over a peripheral portion of the window.

Another preferred embodiment of a cover system for an electrical-energy meter comprises a substantially transparent window. The cover system also comprises a substantially cup-shaped cover comprising a circumferentially-extending side portion, a rim portion unitarily formed with a first end of the side portion and adapted to mate with a base of the electrical-power meter, and a face portion adjoining a second end of the side portion. The face portion has a cutout formed therein and adapted to receive the window, and at least a portion of the lip is molded over a peripheral portion of the window.

BRIEF DESCRIPTION OF THE DRAWINGS

The foregoing summary, as well as the following detailed description of a presently-preferred embodiment, is better understood when read in conjunction with the appended drawings. For the purpose of illustrating the invention, the drawings show an embodiment that is presently preferred. The invention is not limited, however, to the specific instrumentalities disclosed in the drawings. In the drawings.

DESCRIPTION OF PRESENTLY-PREFERRED EMBODIMENTS

A presently-preferred embodiment of a cover system 10 for a solid-state electrical-energy meter 11 is depicted in FIGS. 1–4. It should be noted that the cover system 10 is described in connection with the electrical-energy meter 11 for exemplary purposes only. The cover system 10 can be used in conjunction with virtually any type of electrical-energy meter, including electrical-energy meters of the electro-mechanical type.

Figure 1:
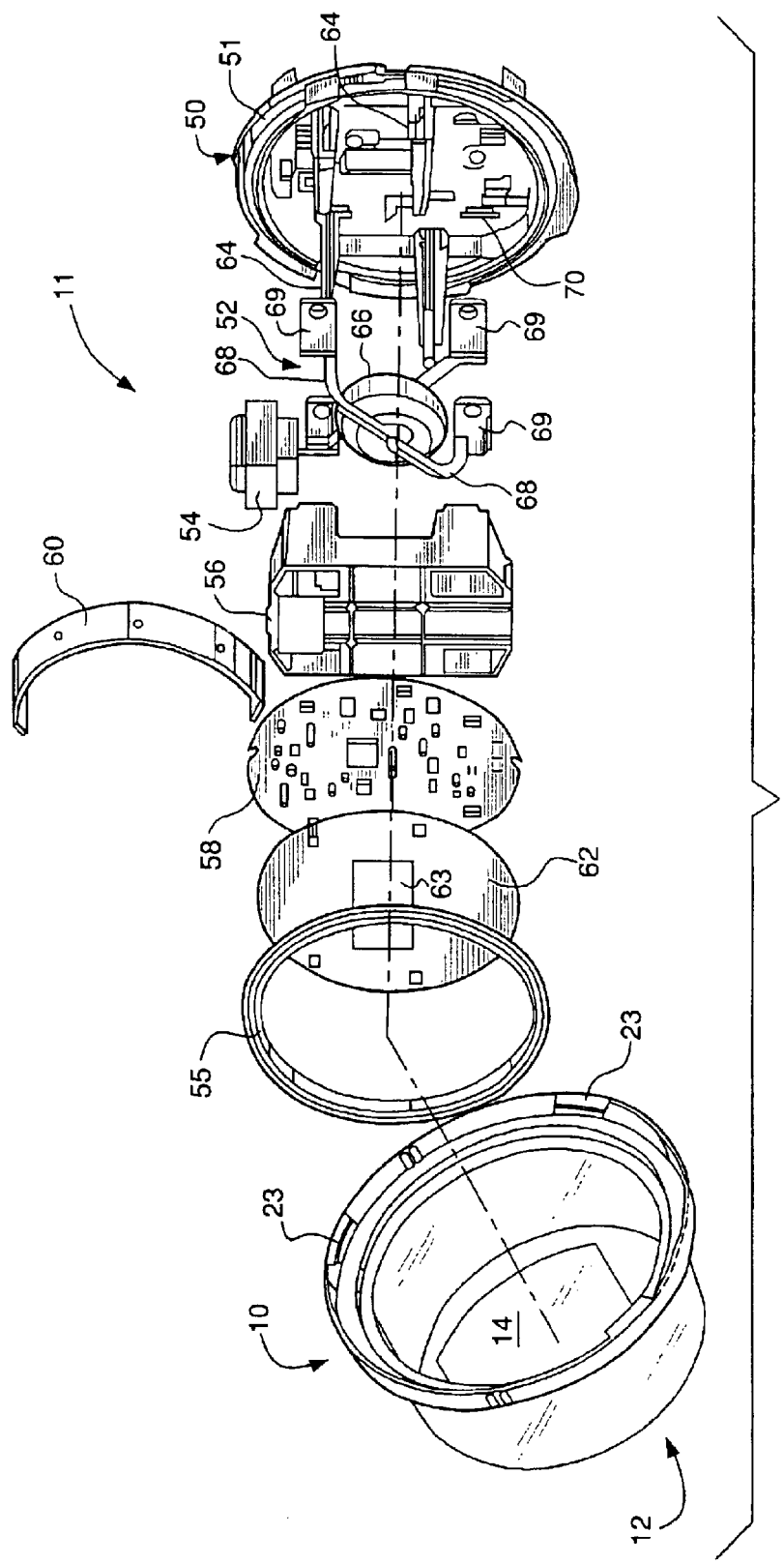
FIG. 1 is an exploded view of an electrical-energy meter, including a preferred embodiment of a cover system for the electrical-energy meter.

The electrical-energy meter 11 is depicted in FIG. 1, and comprises a base 50, a current sensor assembly 52, and a power transformer 54. The current sensor assembly 52 and the power transformer 54 are mounted on the base 50 by way of a retainer 56. The electrical-energy meter 11 also includes a circuit-board assembly 58, a radio-communications antenna 60 mounted on the circuit-board assembly 58, a name plate 62, and a digital display 63 mounted on the name plate 62. The circuit-board assembly 58, radio communications antenna 60, and name plate 62 are mounted on snap posts 64 formed in the base 50.

The current sensor assembly 52 comprises an annular current sensor 66, current conductors 68 that conduct electrical current to the current sensor 66, and meter blades 69 connected to opposite ends of each current conductor 68. The meter blades 69 are retained in the base 50 by way of keyhole slots 70 formed in the base 50. The meter blades 69 are each adapted to slidably and securely engage a corresponding receptacle (not shown) mounted on the residential or commercial establishment in which the electrical-energy meter 11 is used. The engagement of the blades 69 and the corresponding sockets electrically couples the electrical-power meter 11 to the conductor that supplies electrical power to the residential or commercial establishment.

The current sensor 66 is electrically coupled to the circuit-board assembly 58, and is adapted to measure the electrical current flowing through the electrical-power meter 11 by way of the current conductors 68 and the meter blades 69. The meter blades 69 are electrically coupled to the circuit-board assembly 58 through the output of the current sensor (66). The circuit-board assembly 58 thus receives a voltage input that is proportional to the voltage of the conductor that supplies electrical power to the residential or commercial establishment. The circuit-board assembly 58 is adapted to calculate the total (cumulative) watt-hours of power that have passed through the electrical-energy meter 11 over time based on the measured current and the voltage input, using conventional techniques known to those skilled in the field of electrical-energy meter design. The circuit-board assembly 58 continually updates the cumulative watt-hours, and displays the updated value on the digital display 63.

Further details relating to the electrical-energy meter 11 (other than the cover system 10) are not necessary to an understanding of the invention, and therefore are not presented herein.

Details relating to the cover system 10 are as follows. The cover system 10 forms an enclosure shields the other components of the electrical-energy meter 11 from the environment, inhibits tampering with the electrical-energy meter 11, protects the electrical-energy meter 11 from contamination or damage due to contact with foreign objects, etc.

Figure 2:
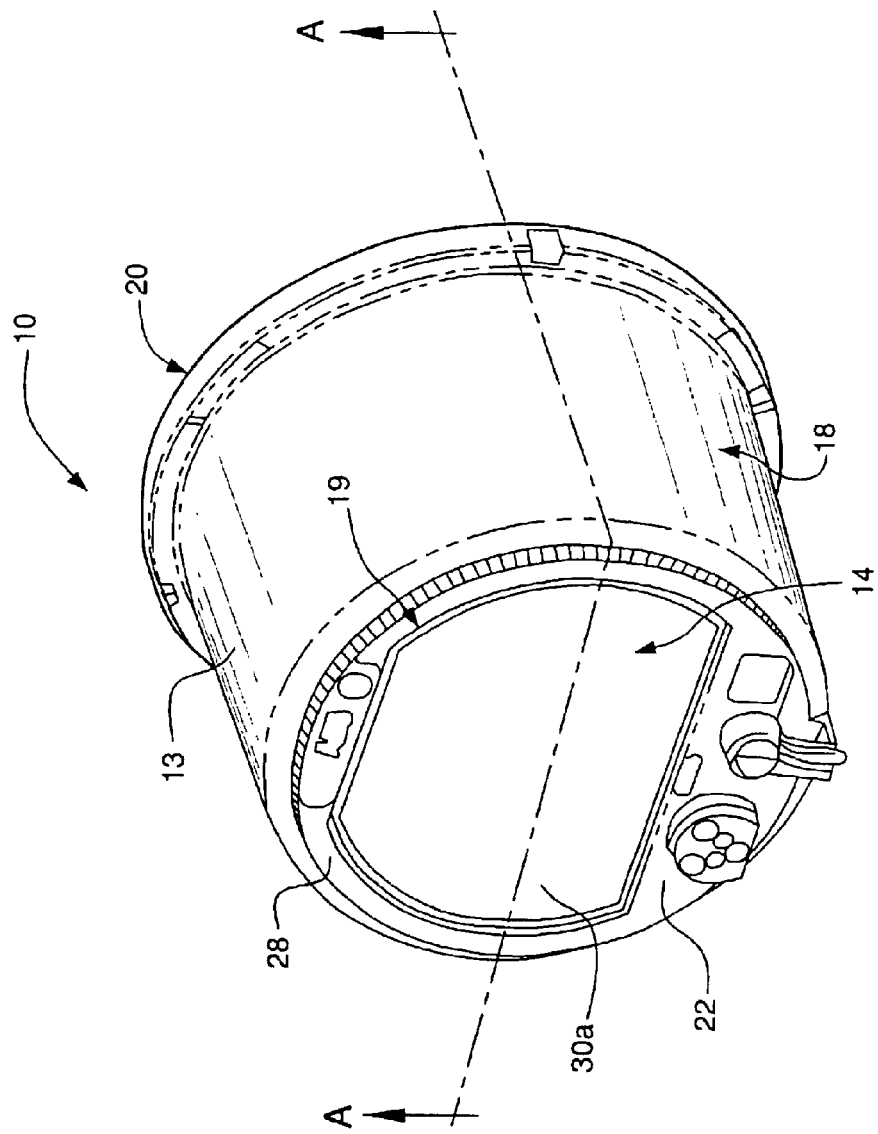
FIG. 2 is a perspective view of the cover system depicted in FIG. 1.
Figure 3:
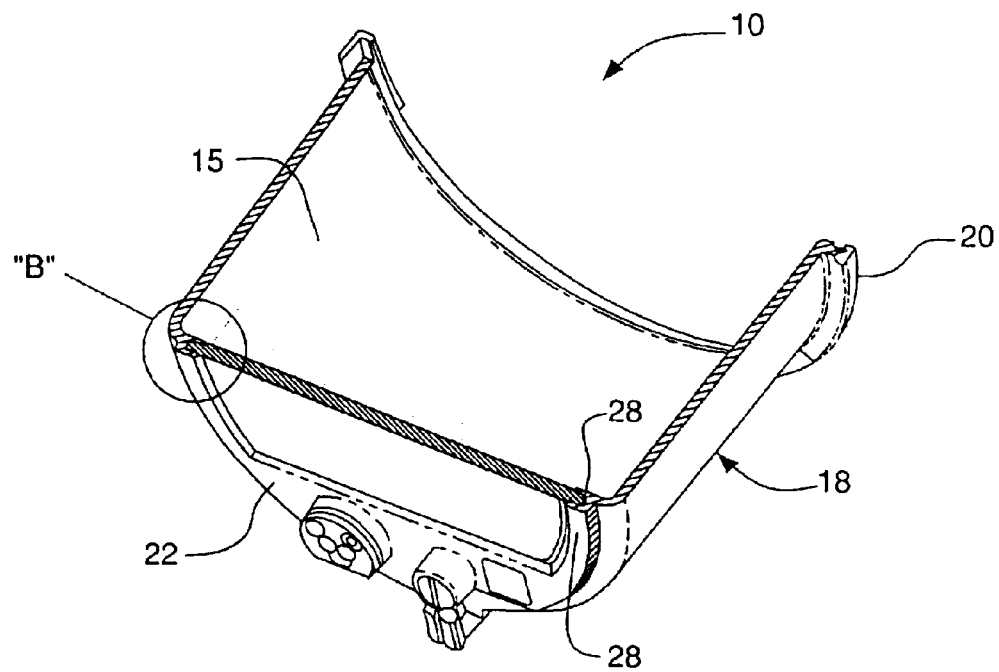
FIG. 3 is a partial cross-sectional view taken through the line "A—A" of FIG. 2.
Figure 4:
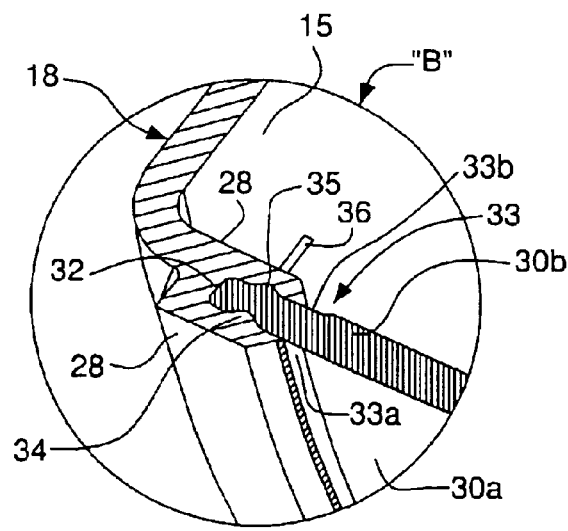
FIG. 4 is a magnified view of the area designated "B" in FIG. 3.

The cover system 10 comprises a cover 12 and a window 14 (see FIGS. 2–4). The cover 12 is preferably formed from a substantially opaque material, i.e., the cover 12 substantially blocks the passage of radiant energy, and especially light. The cover 12 has an outer surface 13 and an inner surface 15. The cover 12 comprises a circumferentially-extending side portion 18, a rim portion 20, and a face portion 22. The rim portion 20 adjoins a first end of the side portion 18, and the face portion 22 adjoins a second end of the side portion 18.

The rim portion 20 is adapted to engage the base 50 of the electrical-energy meter 11. More particularly, the rim portion 20 has a cam structure 23 is positioned around a circumference thereof (see FIG. 1). The cam structure 23 is adapted to securely engage a complementary cam structure 51 on the base 50 to secure the cover 12 to the base 50. A gasket 55 is preferably installed between the rim portion 20 and the base 50 to inhibit water or other contaminates from entering the electrical-energy meter 11 through the interface between the rim portion 20 and the base 50. (It should be noted that the cover 12 can be secured to the base 50 by alternative means such as fasteners.)

The side portion 18 is substantially cylindrical, although the side portion 18 can alternatively be formed in other types of geometric configurations, e.g., frustoconcical.

A cutout 19 is formed in the face portion 22. The cutout 22 is defined by an edge portion 28 in the face portion 22. The cutout 19 accommodates the window 14. More particularly, the window 14 is disposed within the cutout 19, and the edge portion 28 is molded over an edge portion 32 of the window 14. Further details relating to this feature are presented below. (It should be noted that the term "cutout" is used for illustrative purposes only; the cutout 22, as explained in detail below, is formed by molding process that produces the cover 14.)

The window 14 is preferably formed from a substantially transparent material, i.e., from a material that substantially transmits light without appreciable scattering so that bodies lying beyond can be seen clearly. The window 14 thus facilitates visual access to the interior of the electrical-power meter 10. More particularly, the window 14 permits the information displayed on the nameplate 62 and the digital display 63 to be read by, for example, a utility company employee while the cover system 10 is installed on the electric-energy meter 11.

The edge portion 32 forms an outer periphery of the window 14. The window 14 has a first, outward-facing side 30a and a second, inward-facing side 30b. The window 14 includes a mold shutoff section 33 adjacent the edge portion 32 (see FIG. 4). The mold shutoff section 33 is formed by a first substantially smooth surface 33a located on the first side 30a of the window 14, and a second substantially smooth surface 33b located on the second side 30b of the window. The surfaces 33a, 33b preferably extend along a substantial entirety of the inner circumference of the edge portion 32. Hence, the surfaces 33a, 33b are substantially aligned, i.e., the surfaces 33a, 33b are located in substantially identical positions on opposing sides 30a, 30b of the window 14. The purpose of the mold shutoff section 33 is discussed below.

The edge portion 32 preferably has a recess 34 and a ridge 35 formed thereon. The recess 34 is defined by an inwardly-curved surface portion on the first side 30a of the window 14, and the ridge 35 is formed by an outwardly-curved portion on second side 30b of the window. The recess 34 and the ridge 35 are substantially aligned, i.e., the recess 34 and the ridge 35 are located in substantially identical positions on opposing sides 30a, 30b of the window 14. The function of the recess 34 and the ridge 35 is explained below.

The window 14 includes a first and a second pin 36 that project from the edge portion 32, on the second side 30b of the window 14. The purpose of the pins 36 is addressed below.

The cover 12 and the window 14 are each preferably formed from polycarbonate material. Other materials can be used in lieu of polycarbonate, although the cover 12 and the window 14 should be formed from respective materials that are capable of bonding with each other through a molding process.

Figure 5:
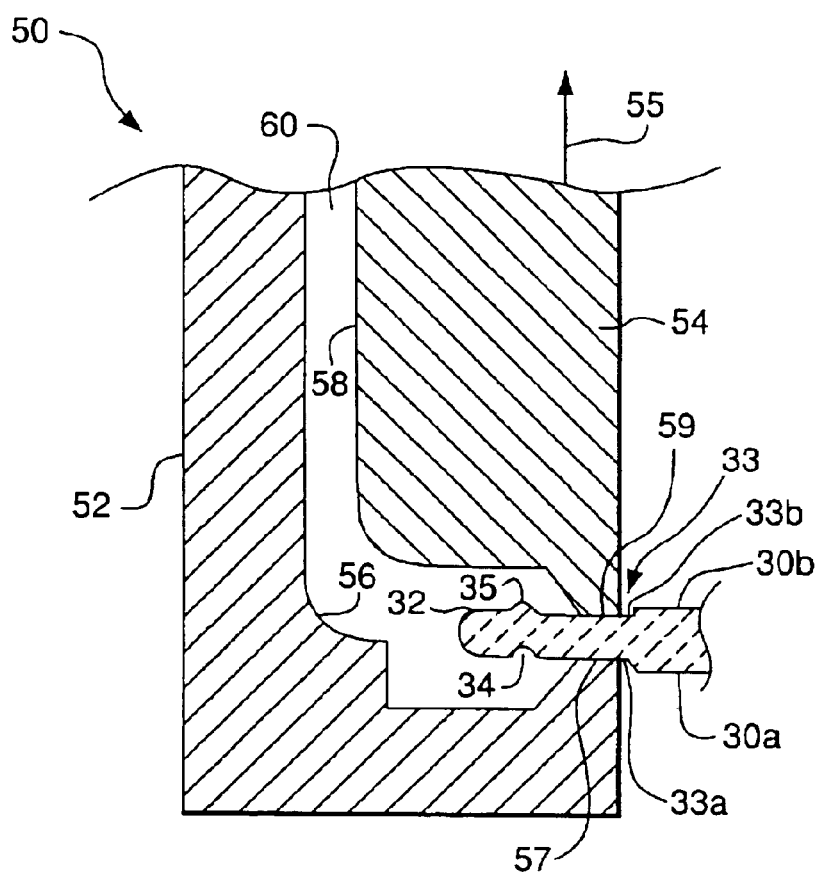
FIG. 5 is a cross-sectional side view of a mold capable of manufacturing the cover system depicted in FIGS. 1–4, showing a portion of a window of the cover system installed in the mold.
Figure 6:
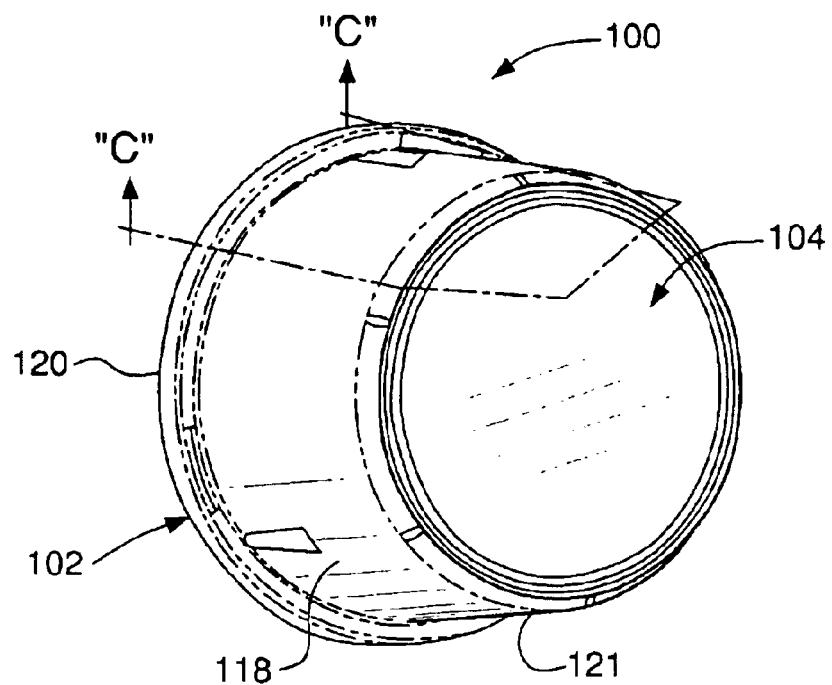
FIG. 6 is a side perspective view of an alternative embodiment of the cover system depicted in FIGS. 1–4.
Figure 7:
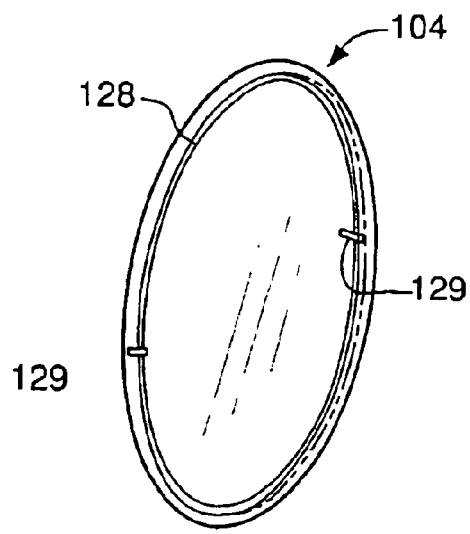
FIG. 7 is a side perspective view of a window of the cover system depicted in FIG. 6.
Figure 8:
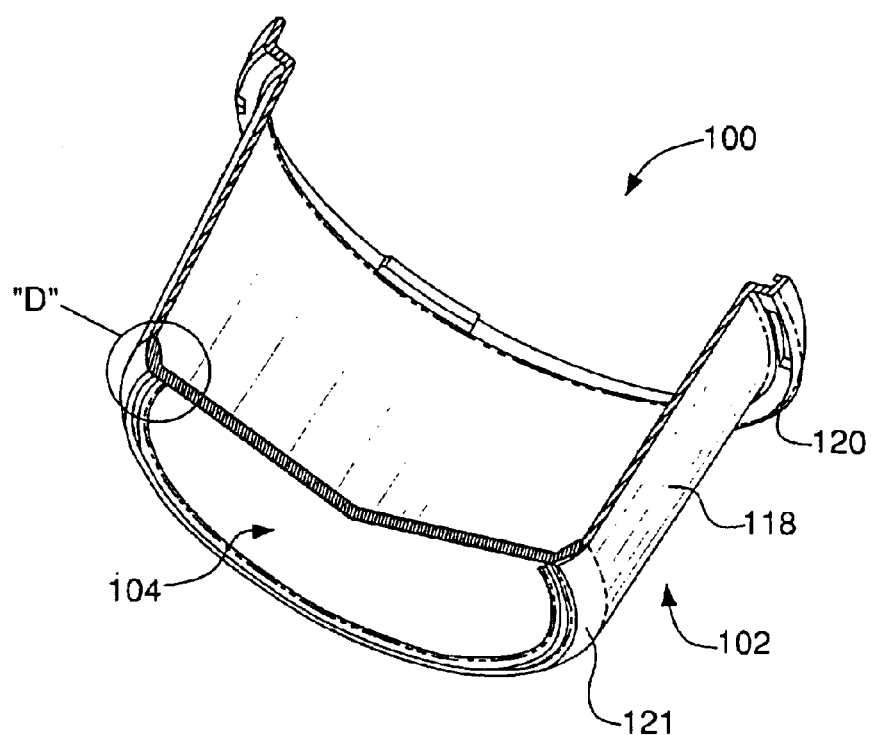
FIG. 8 is a partial cross-sectional view taken through the line "C—C" of FIG. 6.

The cover system 10 is manufactured by molding a portion of the cover 12 over a portion of the window 14. More particularly, the cover 12 can be formed using a mold 50, a portion of which is depicted in FIG. 5. It should be noted that the mold 50 is described in detail for exemplary purposes only; the cover system 10 can be formed using other types of molds.

The mold 50 is adapted to receive the pre-formed window 14, and to mold the edge 28 of the face portion 20 around the edge portion 32 of the window 14.

The mold 50 comprises an outer mold portion 52 and an inner mold portion 54. The outer mold portion 52 has an inner circumferential surface 56 that includes a clamping portion 57. The inner circumferential surface 56 has a shape that substantially matches that of the outer surface 13 of the cover 12. The inner mold portion 54 has an outer circumferential surface 58 that includes a clamping portion 59. The outer circumferential surface 58 has a shape that substantially matches that of the inner surface 15 of the cover 12.

The inner mold portion 54 is adapted to move upwardly from the position depicted in FIG. 5, i.e., in the direction denoted by the arrow 55 in FIG. 5, so that the pre-formed window 14 can be placed on the outer mold portion 52. More particularly, the widow 14 is positioned on the outer mold portion 52 so that the first substantially smooth surface 33a of the mold shutoff section 33 is positioned on the clamping portion 57 of the inner circumferential surface 56.

The inner mold portion 54 is subsequently brought into contact with the window 14. More specifically, the inner mold portion 54 is lowered so that the clamping portion 59 of the outer circumferential surface 58 is urged against the second substantially smooth surface 33b of the mold shutoff section 33. The inner mold portion 54 has bores formed therein (not shown) that each receive a respective one of the pins 36 formed on the window 14. The engagement of the pins 36 and the inner mold portion 54 retains the window 14 in position in relation to the inner mold portion 54.

The mold shutoff section 33 is thus clamped, or pinched, between the inner mold portion 54 and the outer mold portion 52 when the inner mold portion 54 contacts the window 14, as depicted in FIG. 5. Moreover, the inner circumferential surface 56, the outer circumferential surface 58, and the edge portion 32 of the window 14 define a cavity 60 when the mold 50 is configured as shown in FIG. 5.

The cover 12 is formed by introducing molten resin into the cavity 60, preferably by an injection process, i.e., by injecting the molten resin into the cavity 60 under pressure. The molten resin immerses the edge portion 32 as the molten resin fills the cavity 60. The molten resin also contacts the outer circumferential surface 58 of the inner mold portion 54, and the inner circumferential surface 56 of the outer mold portion 52. The clamping force exerted by the inner mold portion 54 and the outer mold portion 52 on the mold shutoff section 33 substantially seals the interface between the inner and outer mold portion 52 and the mold shutoff section 33. In other words, the clamping force exerted by the inner mold portion 54 and the outer mold portion 52 on the mold shutoff section 33 prevents substantial leakage of the molten resin out of the cavity 60.

The molten resin is allowed to cool after being injected into the cavity 60. The molten resin hardens (solidifies) as it cools, and thus forms the cover 12. The molten resin, upon being injected into the cavity 60, immerses the edge portion 32 of the window 14, as noted above. The molten resin thus hardens around the edge portion 32 as the molten resin cools. More particularly, the molten resin located around the edge portion 32 hardens into the edge portion 28 of the cover 12. The edge portion 28 is thereby molded around the edge portion 32 of the window 14.

The inner mold portion 54 is raised, i.e., moved in the direction indicated by the arrow 55 in FIG. 5, as or after the molten resin hardens, thereby permitting the cover 12 and the window 14 to be removed from the mold 50.

The edge portion 28 of the face portion 22 retains the window 14 on the cover 12. Furthermore, the molded interface between the edge portion 28 of the face portion 22 and the edge portion 32 of the window 14 seals the window 14. More particularly, the molten resin that forms the edge portion 28 is believed to bond molecularly with the material that forms the edge portion 32 of the window 14 as the molten resin contacts the edge portion 32 and subsequently cools.

The resulting interface between the edge portions 28, 30 is believed to function as a relatively strong mechanical bond between the cover 12 and the window 14. Moreover, the molecular bonding between the cover 12 and the window 14 at the molded interface is believed to make the interface substantially impervious to water and other contaminates. In other words, the molded interface substantially prevents water and other contaminates from passing between the window 14 and the cover 12 and entering the interior of the electrical-energy meter 11.

The mechanical bond between cover 12 and the window 14 is believed to be strengthened by the recess 34 and the ridge 35 formed on the edge portion 32 of the window 14. More specifically, molding the edge portion 28 of the cover 12 over the edge portion 32 of the window 14 causes the edge portion 28 to substantially conform to the curved surfaces that define the recess 34 and the ridge 35. The resulting contact between the surfaces that define the recess 34 and the ridge 35 and the adjacent portion of the edge portion 28 is believed to substantially increase the strength of the mechanical bond between the cover 12 and the window 14. In other words, the recess 34 and the ridge 35 are believed to facilitate mechanical interlocking between the cover 12 and the window 14. (The recess 34 and the ridge 35, as noted previously, are an optional feature that may be omitted in alternative embodiments of the cover system 10.)

The window 14 can thus be joined to the cover 12, and a strong, watertight bond can be formed between the cover 12 and the window 14, without the need for production techniques such as ultrasonic welding or the application of adhesive. In other words, Applicants have integrated the process by which the window 14 is joined and sealed to the cover 12 with the molding process that forms the cover 12. Hence, the process described herein can eliminate the need for a separate production step (or steps) to join and seal the window 14 to the cover 12, thus shortening the production process and reducing the production cost of the cover system 10. The described process can also eliminate the need for the production equipment associated with the additional production steps, e.g., ultrasonic welding machines, adhesive applicators, etc.

Furthermore, it is believed that integrity in the seal between the cover 12 and the window 14 can be achieved in more consistent manner using the process described herein, in comparison to conventional techniques. Also, molding the cover 12 around the edge portion 32 of the window 14 facilitates the use of features such as the recess 34 and the ridge 35 that further strengthen the mechanical bond between the cover 12 and the window 14. Furthermore, although the window 14 is substantially flat, the mold 50 can readily be configured to accommodate windows having other geometric configurations, e.g., curvilinear.

It is to be understood that even though numerous characteristics and advantages of the present invention have been set forth in the foregoing description, the disclosure is illustrative only and changes may be made in detail within the principles of the invention to the full extent indicated by the broad general meaning of the terms in which the appended claims are expressed.

For example, the FIGS. 6–9 depict an alternative cover system 100 comprising a cover 102 and a substantially circular window 104. The cover system 100 comprises a cover 102 and a window 104. The cover 102 comprises a circumferentially-extending side portion 118, and a rim portion 120 that adjoins a first end of the side portion 118. The cover 102 also comprises a substantially annular lip 121 that adjoins a second end of the side portion 118. The lip 121 is molded around an edge portion 128 of the window 104 (see FIG. 9). The window 104 thus extends around a substantial entirety of the circumference of the side portion 118.

Figure 9:
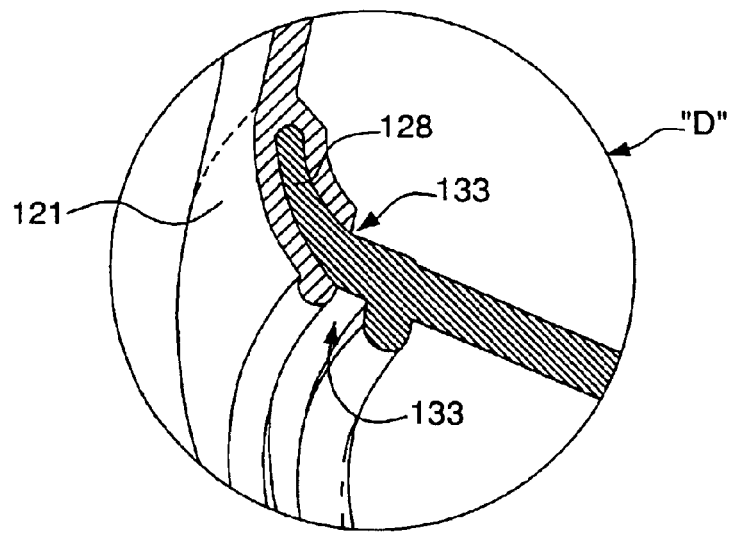
FIG. 9 is a magnified view of the area designated "D" in FIG. 8.

The edge portion 128 of the window 104 is curved inward as depicted, for example, in FIG. 9. The lip 121, which is molded around the edge portion 128, is thus curved inward in a likewise manner. The curved interface between the lip 121 and the edge portion 128 is believed to enhance the strength of the mechanical bond between the cover 102 and the window 104.

The cover system 100 and the cover system 10 are formed in a substantially identical manner. In other words, a mold shutoff section 133 of the window 104 is clamped between portions of a mold substantially similar to the mold 50 so that the mold and the edge portion 128 of the window 104 form a cavity. Pins 129 formed on the window 104 hold the window 104 in position in the mold.

Molten resin is injected into the cavity, and immerses the edge portion 128. The molten resin eventually hardens (solidifies) around the edge portion 128 to form the lip 121. The window 104 is believed to be secured to the cover 102 by molecular bonding between the materials that form the lip 121 and the edge portion 128, and by the mechanical interlocking resulting from the curvilinear shape of the lip 121 and the edge portion 128.

What is claimed is:

1. A process, comprising:
    providing a pre-formed, substantially transparent window for a cover of an electrical-energy meter, the window being formed from a polycarbonate material; and
    molding the cover from a molten resin that, when solidified, is substantially opaque, wherein molding the cover from a molten resin comprises causing a portion of the molten resin to contact an outward facing and an inward facing surface of the window along a periphery of the window and allowing the portion of the molten resin to cool and thereby solidify so that the portion of the molten resin, upon solidifying, is molded over the outward and inward facing surfaces along the periphery of the window and thereby seals and secures the window to the cover, wherein at least a portion of the outward facing surface is substantially parallel to at least a portion of the inward facing surface and the molten resin is formed from the same material as the window.

2. The process of claim 1, further comprising placing the window in a mold and clamping a mold shutoff section of the window between a first and a second portion of the mold so that a seal is formed between the first portion of the mold and the mold shutoff section, and between the second portion of the mold and the mold shutoff section.

3. The process of claim 2, further comprising introducing the molten resin into a cavity defined by the first and second portions of the mold and the periphery of the window.

4. The process of claim 3, wherein introducing the molten resin into the cavity comprises injecting the molten resin into the cavity under pressure.

5. The process of claim 1, wherein molding the cover from a molten resin that, when solidified, is substantially opaque comprises molding the cover from a molten material adapted to bond with the window.

6. A process, comprising:

placing a pre-formed, substantially transparent window for a cover of an electrical-energy meter in a mold;

clamping a substantially ring-shaped portion of the window between a first and a second surface of the mold so that a periphery of the window is positioned within a cavity defined at least in part by the mold and the periphery of the window and a seal is formed between the first surface and the portion of the window, and between the second surface and the portion of the window;

introducing molten resin into the cavity so that the periphery of the mold is substantially immersed in the molten resin; and permitting the molten resin to cool and solidify so that a portion of the molten resin, upon solidifying, is molded around the periphery of the window and thereby seals and secures the window to the cover.

7. The process of claim 6, wherein introducing molten resin into the cavity so that the periphery of the mold is substantially immersed in the molten resin comprises injecting the molten resin into the cavity under pressure.

8. A process, comprising:

clamping a substantially ring-shaped portion of a window for a cover of an electrical-energy meter in a mold so that the window and the mold form a cavity, a portion of the window is positioned within the cavity, and a seal is formed between a first surface of the mold and the window, and between a second surface of the mold and the window; and molding a portion of the cover over the portion of the window positioned within the cavity.

9. The process of claim 8, wherein molding a portion of the cover around the portion of the window positioned within the cavity comprises molding a lip of the cover around the portion of the window positioned within the cavity.

10. The process of claim 8, wherein molding a portion of the cover around the portion of the window positioned within the cavity comprises molding a face portion of the cover around the portion of the window positioned within the cavity.

11. The process of claim 8, wherein molding a portion of the cover around the portion of the window positioned within the cavity comprises immersing the portion of the window positioned within the cavity in molten resin and permitting the molten resin to solidify.

12. The process of claim 8, wherein molding a portion of the cover over the portion of the window positioned within the cavity comprises molding the portion of the cover over a peripheral edge of the window.

13. The process of claim 8, wherein molding a portion of the cover over the portion of the window positioned within the cavity comprises introducing molten resin into the cavity.

14. The process of claim 13, wherein introducing molten resin into the cavity comprises injecting the molten resin into the cavity under pressure.

15. The process of claim 8, wherein clamping a substantially ring-shaped portion of a window for a cover of an electrical-energy meter in a mold so that the window and the mold form a cavity, a portion of the window is positioned within the cavity, and a seal is formed between a first surface of the mold and the window, and between a second surface of the mold and the window comprises clamping a mold shutoff section of the window between the first and second surfaces of the mold.

* * * * *